United States Patent [19]
Liaw et al.

[11] Patent Number: 5,672,538
[45] Date of Patent: Sep. 30, 1997

[54] MODIFIED LOCUS ISOLATION PROCESS IN WHICH SURFACE TOPOLOGY OF THE LOCOS OXIDE IS SMOOTHED

[75] Inventors: Jhon-Jhy Liaw, Sang-Chong; Jin-Yuan Lee, Hsin-Chu; Sou-Wein Kuo, Taipei, all of Taiwan

[73] Assignee: Taiwan Semiconductor Manufacturing Company, LTD, Hsin-Chu, Taiwan

[21] Appl. No.: 567,015

[22] Filed: Dec. 4, 1995

[51] Int. Cl.$^6$ ................................................. H01L 21/76
[52] U.S. Cl. ................................................. 437/69; 437/947
[58] Field of Search ................................. 437/69, 70, 947, 437/981; 148/DIG. 85, DIG. 86, DIG. 117, DIG. 161

[56] References Cited

U.S. PATENT DOCUMENTS

| | | |
|---|---|---|
| 4,407,851 | 10/1983 | Karosana et al. . |
| 4,539,744 | 9/1985 | Burton . |
| 4,612,701 | 9/1986 | Cox . |
| 4,743,566 | 5/1988 | Bastiaens et al. ............... 437/70 |
| 4,942,449 | 7/1990 | Wei et al. ............... 437/69 |
| 5,229,318 | 7/1993 | Straboni et al. ............... 437/69 |
| 5,256,895 | 10/1993 | Bryant et al. ............... 257/501 |
| 5,393,694 | 2/1995 | Mathews . |
| 5,413,953 | 5/1995 | Chien et al. . |
| 5,538,917 | 7/1996 | Kanitou . |
| 5,554,560 | 9/1996 | Hsue et al. . |

FOREIGN PATENT DOCUMENTS

| | | |
|---|---|---|
| 0284124 | 9/1988 | European Pat. Off. . |
| 7611057 | 4/1977 | Germany . |
| 5630738 | 3/1981 | Japan . |
| 57-31164 | 2/1982 | Japan . |
| 58197091 | 9/1985 | Japan . |
| 1244635 | 9/1989 | Japan . |
| 4150030 | 5/1992 | Japan . |
| 582515 | 4/1993 | Japan . |
| 6252137 | 9/1994 | Japan . |
| 2101399 | 1/1983 | United Kingdom . |

OTHER PUBLICATIONS

Wolf S., et al, "Silicon Processing . . . vol. 1", Laltice Press, 1986, pp. 565–567.

*Primary Examiner*—George Fourson
*Attorney, Agent, or Firm*—George O. Saile

[57] ABSTRACT

A method for improving the surface topology silicon wafers during the fabrication of integrated circuits is described. Regions of silicon oxide isolation, incorporated into the silicon surface by thermal oxidation, frequently present an undesirable surface topology consisting of raised regions around their perimeter. These protrusions undermine the integrity of metallization lines subsequently deposited over them. Specifically, the metal lines tend to be thinner over the surface protrusions and consequently incur high failure rates. After the isolation regions are incorporated, a silicon oxide layer is deposited which is then etched back using a unidirectional anisotropic etching step which leaves behind portions of the layer in the regions of the steepest surface gradients. This results in smoothing out the irregularities and consequently provides for more uniform and reliable metallization lines.

14 Claims, 3 Drawing Sheets

MODIFIED LOCUS ISOLATION PROCESS IN WHICH SURFACE TOPOLOGY OF THE LOCOS OXIDE IS SMOOTHED

BACKGROUND OF THE INVENTION (1) Field of the Invention

The invention relates to processes for the manufacture of semiconductor devices and more particularly to processes for improving surface topology of field isolation structures.

(2) Description of Prior Art

The formation of integrated circuit devices on silicon substrates requires that a means be provided to electrically isolate the various circuit components from each other. In many cases p/n junctions themselves can be used to form at least part of the necessary isolation. Most isolation requirements, which cannot be resolved by circuit design, relate to the lateral isolation of devices. To some extent, junction isolation can be used here also. However, as device technology leads to smaller and smaller geometries as well as shallower structures, junction isolation technology becomes very limited.

The successful use of silicon for integrated circuits for the last thirty years can, in part, be attributed to the marvelous insulating properties of it's oxide. No other commonly known semiconductor material has this unique feature. Thus silicon oxide has become well established as the isolation material for integrated circuit chips. Earliest usage of this material involved growing it on the substrate in selected regions which are defined by an oxidation masking material. To this end, silicon nitride came into widespread use. Typically, a pad silicon oxide film 200 Angstroms thick is grown on the silicon wafer surface. Next a film of silicon nitride is deposited to a thickness of several thousand Angstroms using a chemical-vapor-deposition process. With standard photolithographic techniques followed by etching, a pattern is defined in the oxide/nitride mask, leaving bare those regions on the silicon which are to become isolation regions. The wafer is then subjected to an oxidizing ambient at elevated temperatures, during which the exposed areas are converted to silicon oxide. The oxidation proceeds at the oxide-silicon interface. Thereby pockets of silicon oxide several thousand Angstroms deep can be formed in the patterned areas. These pockets provide the necessary electrical isolation for the subsequently formed semiconductor devices. The process just described has become known by several names, one of which is LOCOS an acronym for LOCal Oxidation of Silicon. LOCOS has been practiced for over twenty-five years and has been adapted to many specific applications. One of the most annoying features of LOCOS is the undesirable topology produced on the wafer surface. This topology takes the form of 1.) a raised portion of the oxide around its perimeter, known as "Birds Head" and 2.) a protrusion of oxide under the oxidation mask, caused by oxidation through a thin pad oxide which underlies a silicon nitride layer, and known as "Birds Beak". The oxide for both the birds head and birds beak is formed from the silicon near the mask edge. The birds head, being a protrusion above the surface, causes shadowing and thinning problems with subsequently deposited metallization stripes traversing across it. Thin areas in metal interconnection lines constitute "weak spots" and are subject to increased current density, heating, and subsequent electrical failure. In addition, since the volume of silicon oxide is approximately twice that of the volume of the silicon consumed to produce it, the oxide segment itself extends above the surface plane of the wafer, further aggravating the metallization problems.

Coping with these obstacles has led to numerous methods of abating the effects of surface irregularities caused by the LOCOS field isolation. Effort is always made to keep the additional processing steps simple and minimal, not only for cost and process time considerations but also to reduce the risk of exposure to particulate contamination. The technique taught by this invention is simple, effective, and requires no additional photolithographic steps.

SUMMARY OF THE INVENTION

Accordingly, a simple method for moderating the protruding regions (birds head) along the edges of the field oxide region is described. A typical silicon substrate is provided which has been processed to a point where LOCOS regions have been incorporated by patterning the wafer with an oxidation mask consisting of a thermal silicon pad oxide nominally 100 to 500 Angstroms in thickness, covered by a silicon nitride layer 1000 to 3000 Angstroms thick deposited by low pressure chemical vapor deposition (LPCVD). The LOCOS pattern is defined in the oxidation mask by standard photolithographic techniques, and the mask openings are formed by subjecting the wafer to reactive-ion-etching (RIE) utilizing reactants and conditions to provide a high etch rate ratio of silicon oxide to silicon. Silicon, exposed by the openings in the mask, is next oxidized in a clean furnace, typically by a regimen of oxygen followed by oxygen containing water, and finally by dry oxygen alone. Chlorine containing gases such as hydrogen chloride or trichloroethane are added to the ambient to reduce the presence of mobile ions in the oxide. The oxidation mask is then stripped using chemical etchants. The resultant surface profile contains birds head feature described earlier. The method of this invention provides that, immediately after the removal of the LOCOS masking material a silicon oxide layer, 1500 angstroms thick, is deposited using LPCVD. Next, using a unidirectional etching technique such as reactive-ion-etching with a highly selective silicon oxide etchant such as tetrafluoromethane, the deposit is etched back only long enough to re-expose the silicon. The component of thickness of this oxide layer, normal to the wafer surface, is greater in the regions where underlying surface contouring takes place. Thus, when the unidirectional etch has reach the silicon, portions of the added oxide film remain along the edges of the contour. The result is a broadening and smooting of the contour. The wafer is then returned to normal processing. Semiconductor devices such as high density VLSI MOS field effect transistors are then formed in the regions of the structure not covered by the field oxide.

DESCRIPTION OF THE PREFERRED EMBODIMENTS

Figure 1:
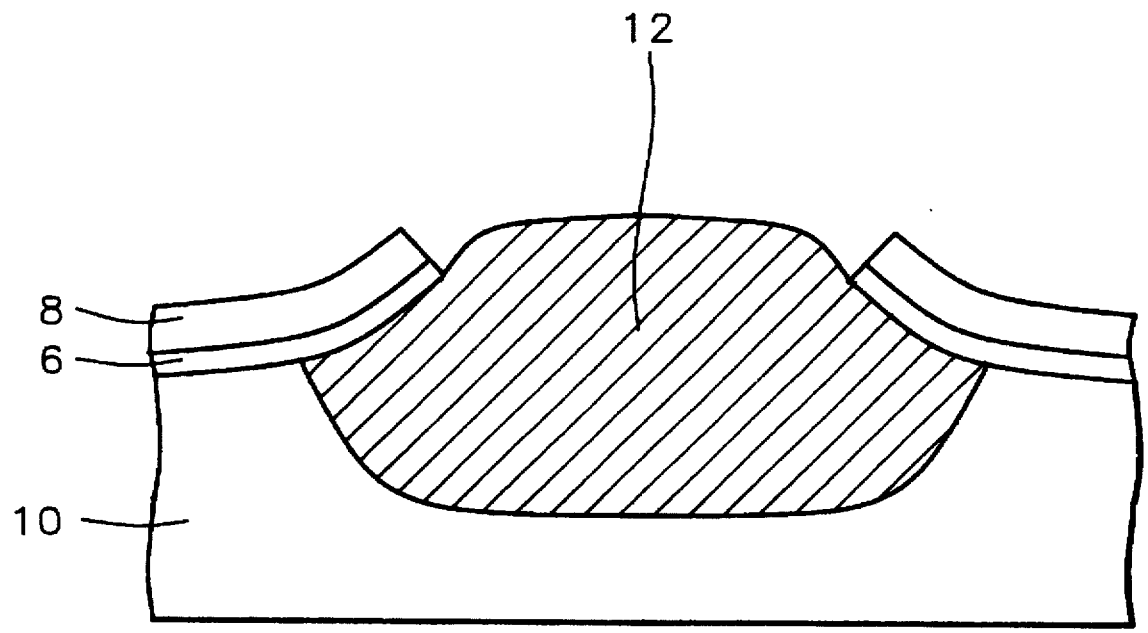
FIG. 1 shows a cross section of the field oxide isolation structure after the oxidation step. The deposited oxidation mask, defined by conventional photolithography, consists of the thermal pad oxide layer 6 and the silicon nitride oxidation barrier 8. The field oxide 12 has pushed up the mask edges because of oxidation through the pad oxide.

Referring now to FIG. 1, a P-doped <100> oriented monocrystalline silicon wafer 10 is used. A multi-layered oxidation mask is provided by first growing a layer of silicon oxide (pad oxide) 6 to a thickness of 100 to 500 Angstroms by subjecting the wafer to a clean dry oxidizing ambient in a furnace between 850° to 1000° C. The silicon nitride layer 8 is then deposited, preferably by low-pressure-chemical-vapor-deposition (LPCVD). Photoresist is applied, exposed, and developed by state-of-the-art means, thereby defining the pattern which will subsequently become the field oxide region. Openings in the oxidation mask are made to expose the silicon surface using conventional anisotropic etching techniques such as reactive-ion-etching. Appropriate etchants and conditions to provide high etch-rate-ratios are well known to those practicing this art such that the taper of the walls of the resultant opening can be well controlled, and the etching can be cleanly terminated at the silicon surface.

The field oxide isolation is grown in a clean oxidation furnace using an ambient gas containing oxygen, either alone or in combination with water, and a chlorine containing additive such as trichloroethane to minimized mobile ion contamination. The oxidation temperature is typically between 950° to 1100° C. FIG. 1 shows a cross section of the field oxide isolation. The thickness of this oxide layer 12 is between 3500 and 6000 Angstroms. Note in the figure that the edges of the oxidation mask have been pushed up by the lateral growth of oxide through the pad oxide. This lateral growth is referred to as birds beak and many process variations have been used to minimize and control it.

Figure 2:
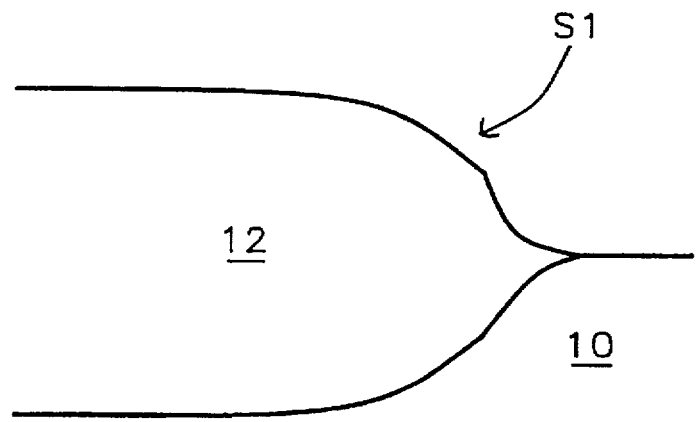
FIG. 2 Shows a portion of the cross section of the LOCOS oxide 12 after the oxidation masking materials have been removed as reproduced from a scanning electron micrograph (SEM). This represents the initial profile of the oxide prior to the embodiments of the method of this invention. S1 represents an abrupt feature on the profile.

The layers which comprise the oxidation mask are next removed by conventional isotropic aqueous etchants. The profile of a portion of the completed field oxide isolation structure 12 is shown in FIG. 2. The occurrence of feature S1 is characteristic of the particular process used to form the isolation oxide.

Figure 3:
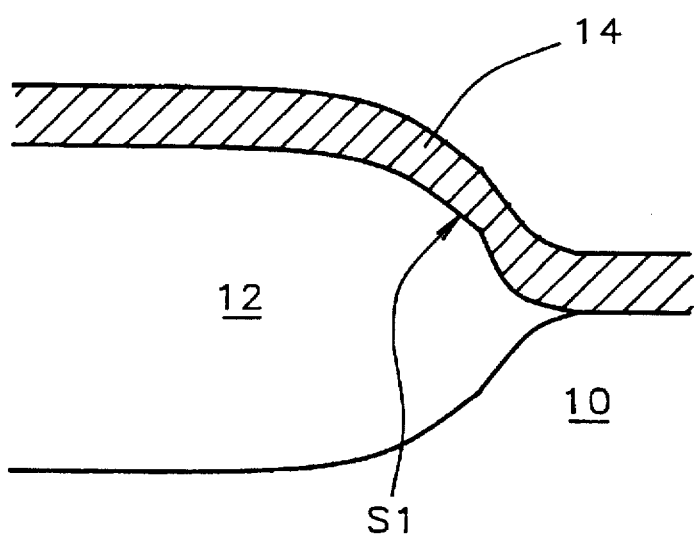
In FIG. 3 a layer of silicon oxide 14 has been deposited over the LOCOS oxide.

A 1350 to 1550 Angstrom layer of silicon oxide 14 is deposited onto the wafer using LPCVD (FIG. 3). This layer is conformal and uniform over the broader regions but tends to be slightly thinner in the vicinity of abrupt corners such as the point S1. Thus the sharpness of this point is not replicated but is attenuated at the surface of the deposited oxide normal to S1.

Figure 4:
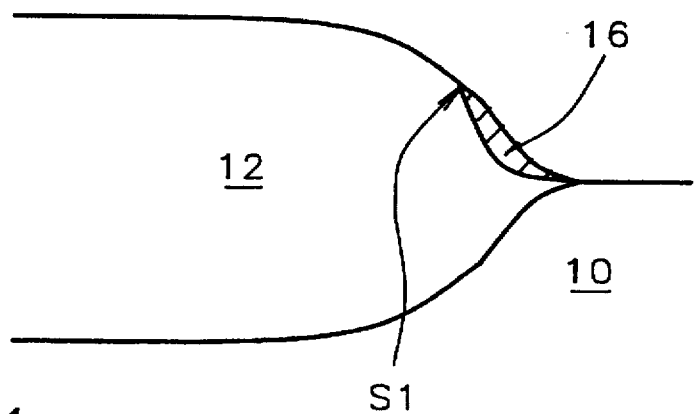
FIG. 4 shows the silicon oxide profile after the deposited silicon oxide has been anisotropically etched by RIE, leaving the remaining pocket of oxide 16.

The wafer is next placed in a reactive-ion-etching station and the oxide layer 14 is etched back to the silicon surface external to the field oxide region. The etching conditions and gaseous ambients are chosen such that the etching proceeds unidirectionally, normal to the plane of the wafer. Further the etch-rate-ratio of silicon oxide to silicon is chosen to be as high as possible to avoid etching of the underlying silicon. Such procedures are well known to the art of reactive-ion-etching and can be achieved with typical RIE stations. The reactant gas is generally tetrafluoromethane ($CF_4$). Precise end-point-detect monitoring during the run is essential to avoid over-etching. This is done by observing the partial pressure of carbon monoxide in the chamber with optical emission spectroscopy. Carbon monoxide is a product of the reaction of silicon oxide with the $CF_4$ etchant gas. A decrease of carbon monoxide in the ambient signals a decrease in surface area of the silicon oxide which indicates that the silicon surface has been reached. The unidirectional feature of the etching, in conjunction with precise cessation of etching, provides a residual pocket 16 of the oxide 14 in regions where topological gradients occur. The final profile of the field oxide isolation is shown in FIG. 4. The pocket 16 of residual oxide has modified the surface contour of the field oxide. The sharp portion of the original profile S1 has been removed and the new oxide surface presents a smoother profile making it more compliant with subsequently deposited metal lines.

Figure 5:
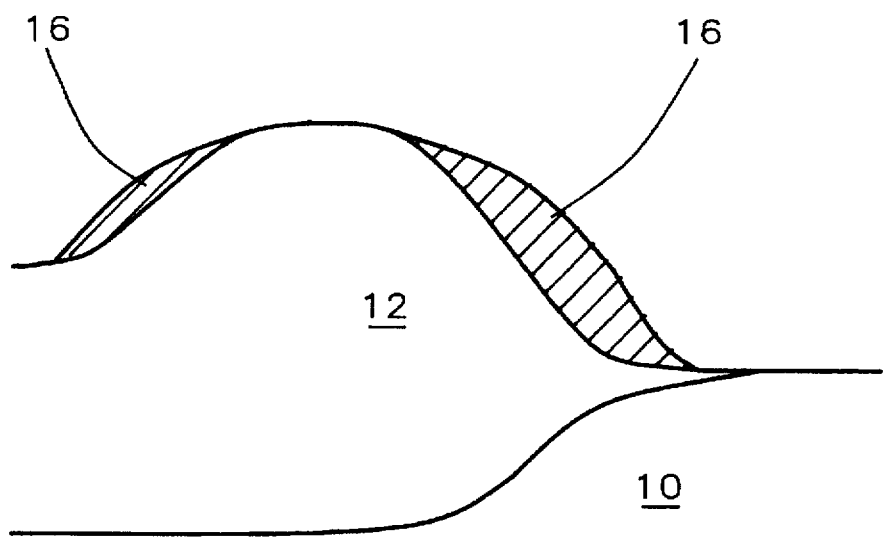
FIG. 5 shows a cross section similar to that of FIG. 4 but of a another variation of the birds head without the abrupt feature S1.

Application of this embodiment to a more familiar variation of the birds head is shown in FIG. 5. In this variation, the abrupt feature S1 of FIG. 2 is absent. The silicon oxide deposition and etchback produces an overall broadening or smoothing out of the protrusion by virtue of the added silicon oxide pockets 16.

During the field oxidation, ammonia is formed by the reaction of water with silicon nitride under the edge of the mask. This has been found to diffuse to the silicon and form a ribbon of silicon nitride under the mask edge. This ribbon is removed prior to the gate oxidation by growing a sacrificial thermal silicon oxide (SAC). The SAC oxide is typically 250 to 500 Angstroms thick and is immediately removed by a chemical dip etch such as 50:1 hydrofluoric acid. The result is that the top 150 or so Angstroms of silicon surface are removed.

Figure 6:
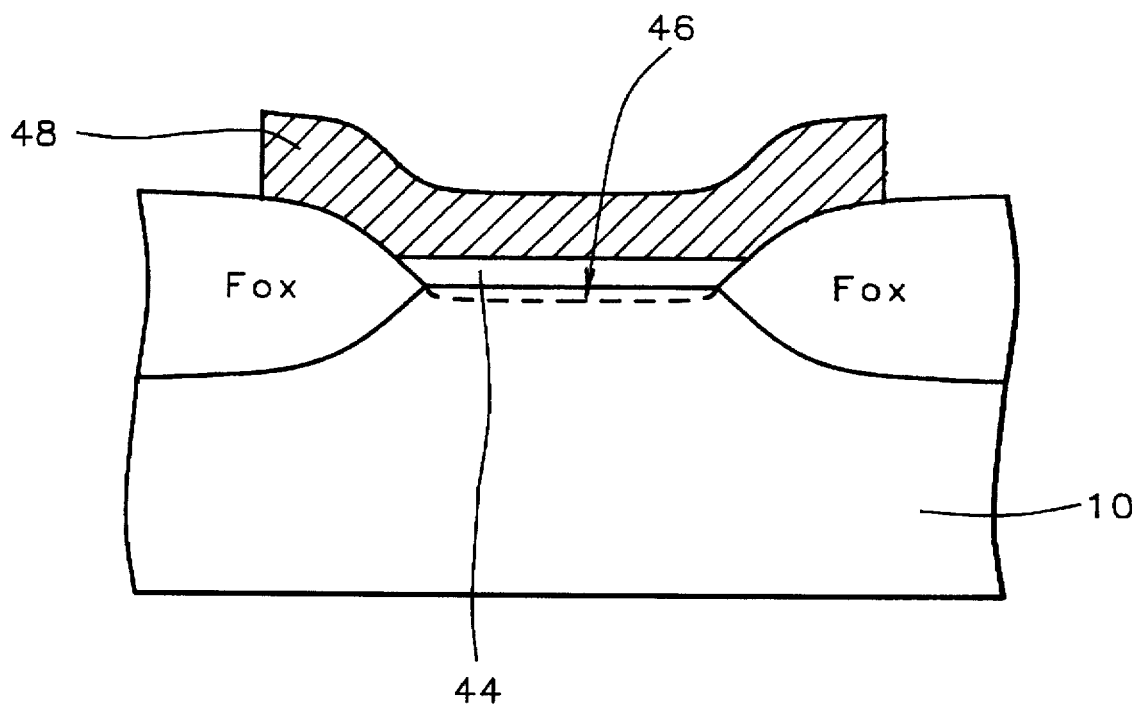
FIG. 6 is a cross section of the channel of a typical narrow channel MOS field effect transistor which can subsequently be formed on the silicon surface between the field oxide regions.

Narrow channel MOS field effect transistor devices are then fabricated in and over the silicon regions adjacent to the field oxide isolation patterns. A cross section of the channel of such a device is shown in FIG. 6 wherein the self-aligned channel 46 is formed between two field oxide isolation regions (FOX). A thin silicon oxide layer 44 overlies the channel 46 and a conductive gate electrode 48 is positioned over the surface of the field isolation (FOX), and the silicon oxide layer 44. The source/drain regions are understood by those skilled in the art are not shown but are located adjacent to the gate region into and out of the paper.

The embodiment of FIGS. 1 through 4 used a P-substrate. It should be well understood by those skilled in the art that N-type substrate conductivities may also be used. It should be further understood that the substrate conductivity type as referred to here does not necessarily refer to the conductivity of the starting wafer but could also be the conductivity of a diffused region within a wafer wherein a field oxide is to be incorporated.

While the invention has been particularly shown and described with reference to the preferred embodiments thereof, it will be understood by those skilled in the art that various changes in form and details may be made without departing from the spirit and scope of the invention.

What is claimed is:

1. A method for forming field oxide isolation structure comprising:

providing a silicon substrate;

forming a multilayer oxidation masking structure having a first silicon oxide layer and a silicon nitride layer;

forming a mask by removing said silicon nitride layer and said first silicon oxide layer over regions where said field oxide isolation structures are to be formed;

oxidizing said regions to form said field oxide isolation structures;

removing resulting remaining portions of the silicon nitride layer with aqueous chemical etchants;

depositing a second silicon oxide layer over said silicon substrate; and anisotropically etching said second silicon oxide layer using a method of end-point-detection to terminate the anisotropic etching of said second silicon oxide layer upon exposure of the silicon substrate, taking care not to remove resultant remaining portions of said second silicon oxide layer which lie adjacent to topological contours.

2. The method of claim 1 wherein the anisotropic etching is reactive-ion-etching, accompanied by conditions and etchant gas which afford etching directionality normal to the plane of the silicon substrate.

3. The method of claim 2 wherein the etchant gas contains tetrafluoromethane.

4. The method of claim 1 wherein the method of end-point-detection is optical emission spectroscopy.

5. The method of claim 4 wherein the intensity of a carbon monoxide (CO) signal is utilized to determine when the end point has been reached.

6. The method of claim 1 wherein the second silicon oxide layer is deposited by low-pressure-chemical-vapor-deposition (LPCVD).

7. The method of claim 1 wherein the second silicon oxide layer is between 1350 and 1650 Angstroms thick.

8. A method for fabricating semiconductor devices having field oxide isolation structures comprising:

providing a silicon substrate;

forming a multilayer oxidation masking structure having a first silicon oxide layer and a silicon nitride layer;

forming a mask by removing said silicon nitride layer and said first silicon oxide layer over regions where said field oxide isolation structures are to be formed;

oxidizing said regions to form said field oxide isolation structures;

removing resulting remaining portions of the silicon nitride layer with aqueous chemical etchants;

depositing a second silicon oxide layer over said silicon substrate;

anisotropically etching said second silicon oxide layer using a method of end-point-detection to terminate the anisotropic etching of said second silicon oxide layer upon exposure of the silicon substrate, taking care not to remove resultant remaining portions of said second silicon oxide layer which lie adjacent to topological contours; and forming semiconducting devices within the re-exposed silicon regions.

9. The method of claim 8 wherein the anisotropic etching is reactive-ion-etching, accompanied by conditions and etchant gas which afford etching directionality normal to the plane of the substrate.

10. The method of claim 9 wherein the etchant gas contains tetrafluoromethane.

11. The method of claim 8 wherein the method of end-point-detection is optical emission spectroscopy.

12. The method of claim 11 wherein the intensity of a carbon monoxide (CO) signal us utilized to determine when the end point has been reached.

13. The method of claim 8 wherein the second silicon oxide layer is deposited by low-pressure-chemical-vapor-deposition (LPCVD).

14. The method of claim 8 wherein the second silicon oxide layer is between 1350 and 1650 Angstroms thick.

* * * * *